(12) United States Patent
Sreenivasan (10) Patent No.: US 7,323,417 B2
(45) Date of Patent: Jan. 29, 2008

(54) METHOD OF FORMING A RECESSED STRUCTURE EMPLOYING A REVERSE TONE PROCESS

(75) Inventor: Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 11/611,287

(22) Filed: Dec. 15, 2006

(65) Prior Publication Data

US 2007/0082461 A1 Apr. 12, 2007

Related U.S. Application Data

(63) Continuation of application No. 10/946,570, filed on Sep. 21, 2004, now Pat. No. 7,186,656.

(51) Int. Cl.
*H01L 21/311* (2006.01)
*B44C 1/22* (2006.01)

(52) U.S. Cl. .......................................... 438/700; 216/41
(58) Field of Classification Search ................ 438/692, 438/700, 735, 739, 745, 751; 216/41
See application file for complete search history.

(56) References Cited

U.S. PATENT DOCUMENTS 7,186,656 B2 * 3/2007 Sreenivasan ................ 438/700
2004/0211754 A1 * 10/2004 Sreenivasan ................. 216/41

* cited by examiner

*Primary Examiner*—Calvin Lee
(74) *Attorney, Agent, or Firm*—Michael D. Carter; Fish & Richardson P.C.

(57) ABSTRACT

The present invention provides a method of forming recesses on a substrate, the method including forming on the substrate a patterning layer having first features; trim etching the first features to define trimmed features having a shape; and transferring an inverse of the shape into the substrate.

37 Claims, 7 Drawing Sheets

METHOD OF FORMING A RECESSED STRUCTURE EMPLOYING A REVERSE TONE PROCESS

CROSS-REFERENCE TO RELATED APPLICATIONS

The present application is a continuation of U.S. patent application Ser. No. 10/946,570, filed on Sep. 21, 2004 now U.S. Pat. No. 7,186,656 entitled "Method of Forming a Recessed Structure Employing a Reverse Tone Process," which is a continuation-in-part of U.S. patent application Ser. No. 10/850,876 filed on May 21, 2004 now abandoned entitled "A Method of Forming a Recessed Structure Employing a Reverse Tone Process," both of which are incorporated by reference herein.

BACKGROUND OF THE INVENTION

The field of the invention relates generally to micro-fabrication of structures. More particularly, the present invention is directed to creating recessed structures utilizing a trim etch process followed by reverse toning of the recessed structures.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication have been employed include biotechnology, optical technology, mechanical systems and the like.

A method of reducing the minimum feature dimension of structures formed from micro-fabrication is disclosed in U.S. Pat. No. 6,541,360 to Plat et al. Plat et al. describes a bi-layer trim etch process to form integrated circuit gate structures having small critical dimensions. More specifically, Plat et al. describes forming a multi-layered structure by depositing an organic underlayer over a layer of polysilicon, depositing an imaging layer over the organic underlayer, and patterning the imaging layer. The imaging layer is then utilized as a hard mask to selectively trim etch the organic underlayer to form a pattern smaller than that produced by the imaging layer. The hard mask imaging layer is then removed, and finally, the portions of the polysilicon layer are etched using the pattern formed by the organic underlayer. This allows for formation of a gate pattern with widths less than the widths of the pattern of the imaging layer.

What is desired, however, is a technique to form a structure having holes/trenches of a reduced critical dimension.

SUMMARY OF THE INVENTION

The present invention provides a method of forming recesses on a substrate, the method including forming on the substrate a patterning layer having first features; trim etching the first features to define trimmed features having a shape; and transferring an inverse of the shape into the substrate. These embodiments and others are described more fully below.

DETAILED DESCRIPTION OF THE INVENTION

Figure 1:
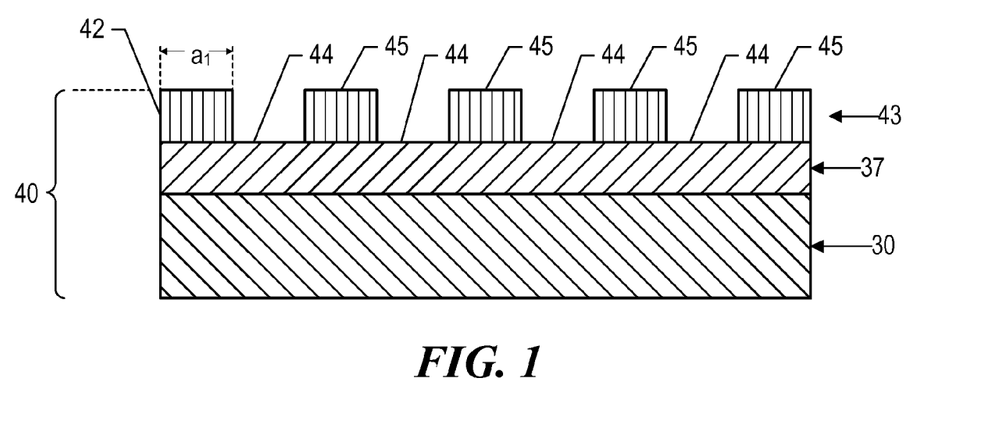
FIG. 1 is a simplified elevation view of a multi-layered structure.

Referring to FIG. 1, a multi-layered structure 40 is shown having a substrate 30, a transfer layer 37, and an imaging layer 43, with transfer layer 37 being positioned between imaging layer 43 and substrate 30. Substrate 30 may be formed from materials including, but not limited to, silicon, gallium arsenide, quartz, fused-silica, sapphire, organic polymers, siloxane polymers, borosilicate glass, fluorocarbon polymers or a combination thereof. Transfer layer 37 and imaging layer 43 may be formed using any known techniques, dependent upon the materials and application desired. For example, the etching process that may be employed to remove material from transfer layer 37 and imaging layer 43, as well as substrate 30, may be any known in the semiconductor processing art. The etching process employed is dependent upon the materials employed and the application desired. Techniques that may be employed to deposit transfer layer 37 and imaging layer 43 include, but are not limited to, chemical vapor deposition (CVD), physical vapor deposition (PVD), sputter deposition, spin-coating and dispensing of a liquid.

Transfer layer 37 may be an anti-reflective coating (BARC) layer, such as DUV30J-6 available from Brewer Science, Inc. of Rolla, Mo. Additionally, transfer layer 37 may be a silicon-containing low-k layer, or a BCB layer, for example. In an alternative embodiment, a composition for transfer layer 37 may be silicon-free and consists of the following:

COMPOSITION 1 isobornyl acrylate n-hexyl acrylate ethylene glycol diacrylate 2-hydroxy-2-methyl-1-phenyl-propan-1-one In COMPOSITION 1, isobornyl acrylate comprises approximately 55% of the composition, n-hexyl acrylate comprises approximately 27%, ethylene glycol diacrylate comprises approximately 15% and the initiator 2-hydroxy-2-methyl-1-phenyl-propan-1-one comprises approximately 3%. The initiator is sold under the trade name DAROCUR® 1173 by CIBA® of Tarrytown, N.Y. The above-identified composition also includes stabilizers that are well known in the chemical art to increase the operational life of the composition.

Imaging layer 43 has a plurality of features 44 and 45 to provide imaging layer 43 with etch properties that differ from the etch properties of transfer layer 37. Features 44 and 45 may be formed by such techniques including, but not limited to, photolithography (various wavelengths including G line, I line, 248 nm, 193 nm, 157 nm, and 13.2-13.4 nm), e-beam lithography, x-ray lithography, ion-beam lithography, atomic beam lithography, and imprint lithography. Imprint lithography is described in numerous publications, such as United States published patent application 2004/0065976 filed as U.S. patent application Ser. No. 10/264,960, entitled "Method and a Mold to Arrange Features on a Substrate to Replicate Features Having Minimal Dimensional Variability;" United States published patent application 2004/0065252 filed as U.S. patent application Ser. No. 10/264,926, entitled "Method of Forming a Layer on a Substrate to Facilitate Fabrication of Metrology Standards;" and United States published patent application 2004/0046271 filed as U.S. patent application Ser. No. 10/235,314, entitled "Functional Patterning Material for Imprint Lithography Processes," all of which are assigned to the assignee of the present invention and are incorporated by reference herein. An exemplary lithographic system is available under the trade name IMPRIO 100™ from Molecular Imprints, Inc., having a place of business at 1807-C Braker Lane, Suite 100, Austin, Tex. 78758. The system description for the IMPRIO 100™ is available at www.molecularimprints.com and is incorporated herein by reference.

Figure 2:
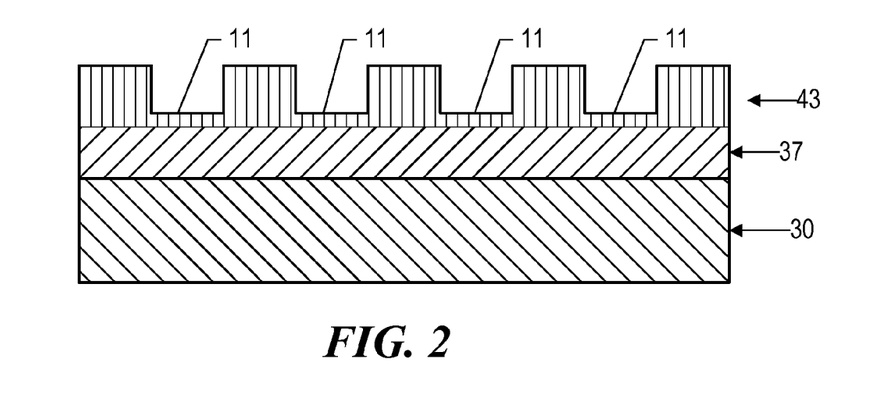
FIG. 2 is a simplified elevation view of a multi-layered structure formed by imprint lithography.

Referring to FIGS. 1 and 2, employing imprint lithography to form features 44 and 45 may result in the formation of residual portions 11 of imaging layer 43 in superimpositions with features 44. Thus, to remove residual portions 11, a break-through each may be employed such that multi-layered structure 40 shown in FIG. 1 is formed.

Referring to FIG. 1, as mentioned above, features 44 and 45 provide imaging layer 43 with each properties that differ from the etch properties of transfer layer 37. To that end, the etch properties of imaging layer 43 enable imaging layer 43 to serve as a hard mask for transfer layer 37. To that end, imaging layer 43 may be formed from a silicon organic material having a silicon content laying in the range of 3% to 40% be weight or other materials that may be photo-image capable. Imaging layer 43 may be deposited by spin-coating onto transfer layer 37 a silicon-containing material with sufficient thickness so that the desired etch differential characteristics with respect to transfer layer 37 are obtained for given etch processes. Exemplary material from which to form imaging layer 43 include COMPOSITION 2 and COMPOSITION 3, discussed more fully below. After patterning features 44 and 45 into imaging layer 43, multi-layered structure 40 is exposed to a trim etch process. In a further embodiment, imaging layer 43 and transfer layer 37 may be formed by the SiBER™ DUV bi-layer resist platform available from Rohm and Haas of Philadelphia, Pa. The description for the SiBER™ DUV bi-layer resist platform is available at http://electronicmaterials.rohmhaas.com/businesses/micro/lithography/248photo.asp?caid=240 and is incorporated herein by reference.

Figure 3:
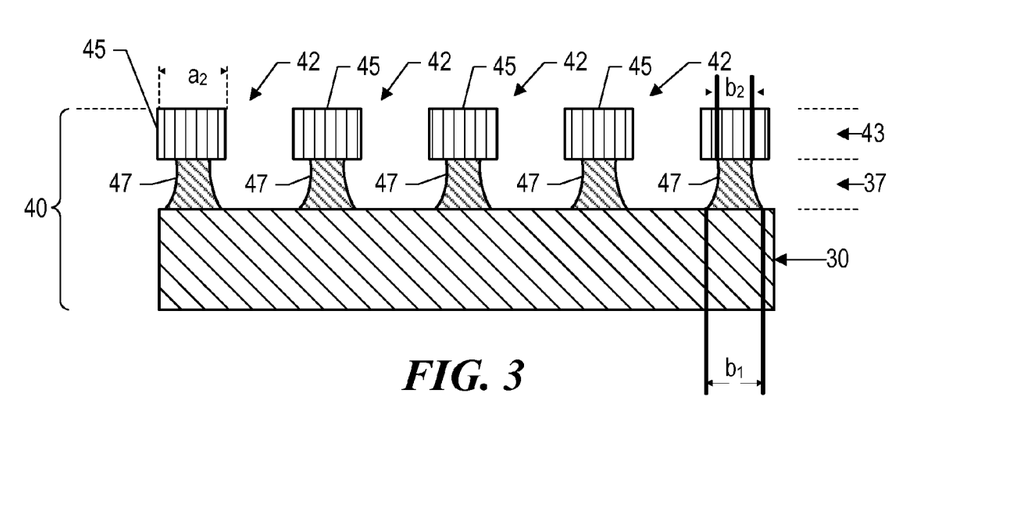
FIG. 3 is a simplified elevation view of the multi-layered structure, shown in FIG. 1, after the multi-layered structure is exposed to a trim etching process.

Referring to FIG. 3, the trim etch process forms protrusions 42 in multi-layered structure 40. Each of protrusions 42 includes features 45 and a portion of transfer layer 37 in superimposition therewith, referred to as a body 47. The width '$a_1$,' shown in FIG. 1, of features 45 may be reduced by the trim etch process to provide features 45 with a width '$a_2$.' Specifically, material is removed from features 45 during the trim etch process so that width '$a_1$,' shown in FIG. 1, is greater than width '$a_2$.' Similarly, material is removed from transfer layer 37. Specifically, transfer layer 37 is partially exposed to the trim etch process so that portions of transfer layer 37 in superimposition with features 44, shown in FIG. 1, are removed. This results from imaging layer 43 functioning as a mask for transfer layer 37 during the trim etch process. The portions of transfer layer 37 in superimposition with features 45 are partially etched as well. In this manner, body 47 has varying dimensions over the length thereof. The width '$b_1$,' of body 47 at an interface of body 47 and substrate 30 is greater than the width '$b_2$' of body 47 at the interface of body 47 and imaging layer 43. Width '$b_1$' may be substantially the same as width '$a_2$' or smaller and width '$b_2$' may be less than width '$a_2$.'

Figure 4:
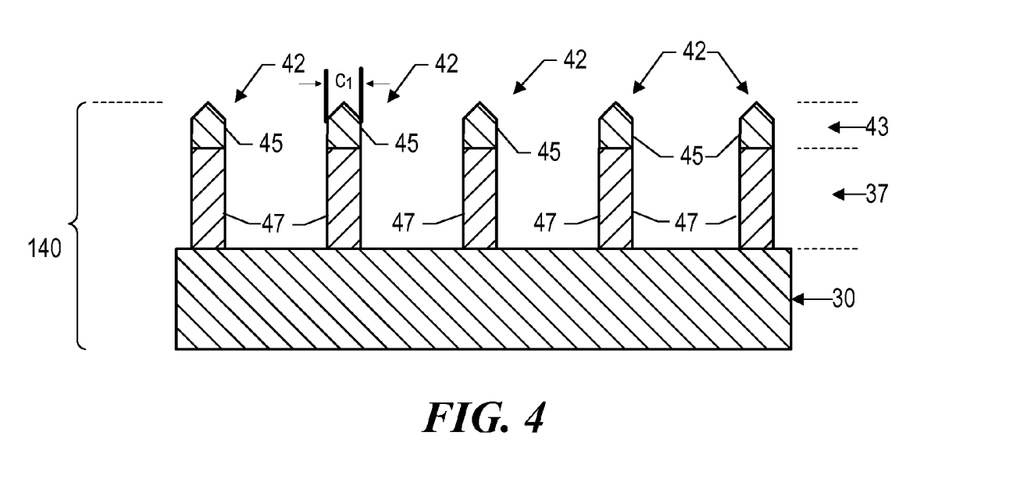
FIG. 4 is a simplified elevation view of the multi-layered structure, shown in FIG. 3, after selectively etching the multi-layered structure.

Referring to FIGS. 3 and 4, after subjecting multi-layered structure 40 to the above-mentioned trim etch process, multi-layered structure 40 is subsequently exposed to a second etching process to provide remaining portions of transfer layer 37 with uniform dimensions. Specifically, transfer layer 37 is selectively etched using the remaining portions of imaging layer 43 as a mask. In this manner, a multi-layered structure 140 is formed. Multi-layered structure 140 has protrusions 42 with a width '$c_1$.' Width '$c_1$' may be substantially the same as width '$b_2$.' In a further embodiment, width '$c_1$' may be less than width '$b_2$.' As a consequence of exposing multi-layered structure 140 to the above-mentioned etching process, features 45 become faceted, referred to as faceted material. It is desired to remove the faceted portions. The manner in which the faceted portions may be removed is dependent upon the material from which the same is formed. To that end, one manner in which to remove the faceted material is by exposing the same to a hydrofluoric acid (HF) dip. Alternatively, the material from which the faceted portions is formed may be photo-responsive in that the same may be exposed to radiation and subsequently exposed to a chemical to remove the faceted portions, not unlike a photo-resist material. It is desired, however, that the process for removing the faceted portions minimize or avoid faceting of the remaining portions of protrusions 42 to form protrusions 54, shown in FIG. 5.

Figure 5:
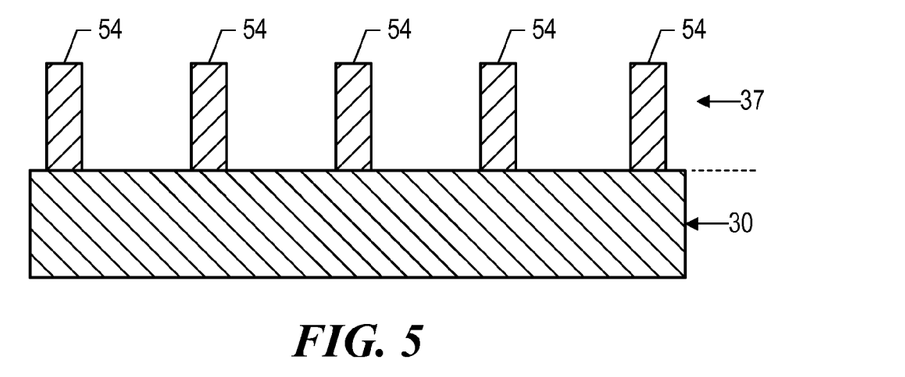
FIG. 5 is a simplified elevation view of the multi-layered structure, shown in FIG. 4, after the multi-layered structure has been exposed to a dip etch.
Figure 6:
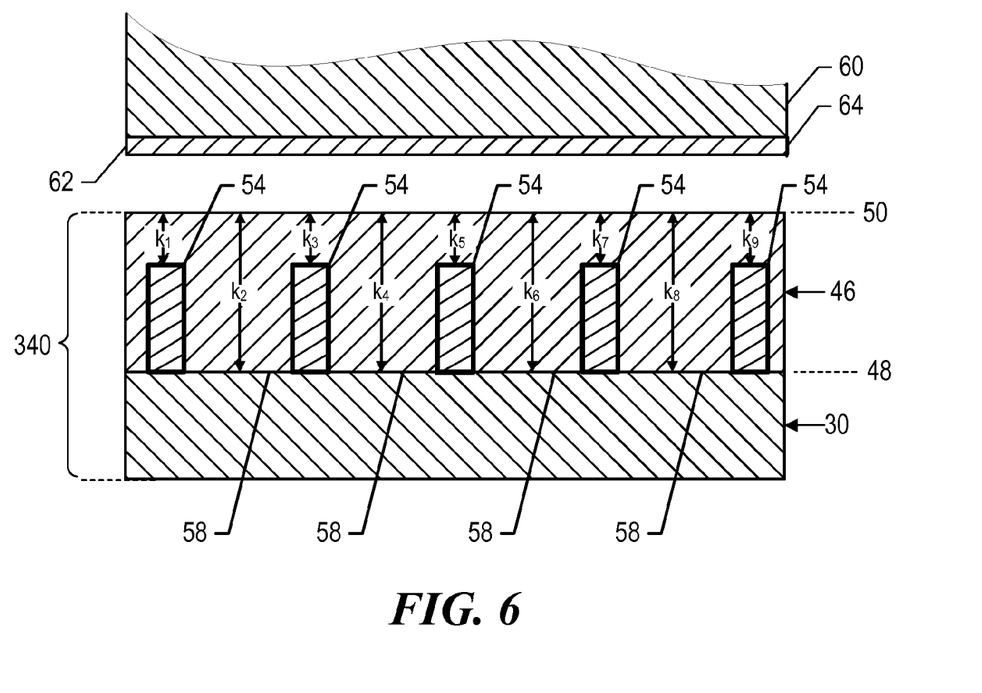
FIG. 6 is a simplified elevation view of the multi-layered structure, shown in FIG. 5, after deposition of a conformal layer.

Referring to FIGS. 5 and 6, after removal of the faceted portions, the reverse tone of protrusions 54 are transferred into substrate 30. To that end, a conformal layer 46 may be deposited over protrusions 54 forming multi-layered structure 340. This may be achieved by methods including, but not limited to, spin-on techniques, contact planarization, and the like. To that end, conformal layer 46 may be formed from a polymerizable material. Exemplary compositions from which to form conformal layer 46 are as follows:

COMPOSITION 2 hydroxyl-functional polysiloxane hexamethoxymethylmelamine toluenesulfonic acid methyl amyl ketone

COMPOSITION 2 hydroxyl-functional polysiloxane hexamethoxymethylmelamine gamma-glycidoxypropyltrimethoxysilane toluenesulfonic acid methyl amyl ketone In COMPOSITION 2, hydroxyl-functional polysiloxane comprises approximately 4% of the composition, hexamethoxymethylmelamine comprises approximately 0.95%, toluenesulfonic acid comprises approximately 0.05% and methyl amyl ketone comprises approximately 95%. In COMPOSITION 3, hydroxyl-functional polysiloxane comprises approximately 4% of the composition, hexamethoxymethylmelamine comprises approximately 0.7%, gamma-glycidoxypropyltrimethoxysilane comprises approximately 0.25%, toluenesulfonic acid comprises approximately 0.05%, and methyl amyl ketone comprises approximately 95%.

Conformal layer 46 includes first and second opposed sides. First side 48 faces substrate 30. The second side faces away from substrate 30, forming normalization surface 50. Normalization surface 50 is provided with a substantially normalized profile by ensuring that the distances $k_1$, $k_3$, $k_5$, $k_7$, and $k_9$ between protrusions 54 and normalization surface 50 are substantially the same and that the distance $k_2$, $k_4$, $k_6$, and $k_8$ between recessions 58 and normalization surface 50 are substantially the same.

One manner in which to provide normalization surface 50 with a normalized profile is to contact conformal layer 46 with a planarizing mold 60 having a planar surface 62. Thereafter, planarizing mold 60 is separated from conformal layer 46 and radiation impinges upon conformal layer 46 to polymerize and, therefore, to solidify the same. The radiation impinged upon conformal layer 46 may be ultraviolet, thermal, electromagnetic, visible light, heat, and the like. In a further embodiment, the radiation impinged upon conformal layer 46 may be impinged before planarizing mold 60 is separated from conformal layer 46. To ensure that conformal layer 46 does not adhere to planarizing mold 60, a low surface energy coating 64 may be deposited upon planarizing mold 60.

Alternatively, release properties of conformal layer 46 may be improved by including in the material from which the same is fabricated a surfactant. The surfactant provides the desired release properties to reduce adherence of conformal layer 46 to planarizing mold 60. For purposes of this invention, a surfactant is defined as any molecule, one tail of which is hydrophobic. Surfactants may be either fluorine containing, e.g., include a fluorine chain, or may not include any fluorine in the surfactant molecule structure. An exemplary surfactant is available under the trade name ZONYL® FSO-100 from DUPONT™ that has a general structure of $R_1R_2$, where $R_1=F(CF_2CF_2)_y$, with y being in a range of 1 to 7, inclusive and $R_2=CH_2CH_2O(CH_2CH_2O)_xH$, where X being in a range of 0 to 15, inclusive. It should be understood that the surfactant may be used in conjunction with, or in lieu of, low surface energy coating 64 that may be applied to planarizing mold 60.

Figure 7:
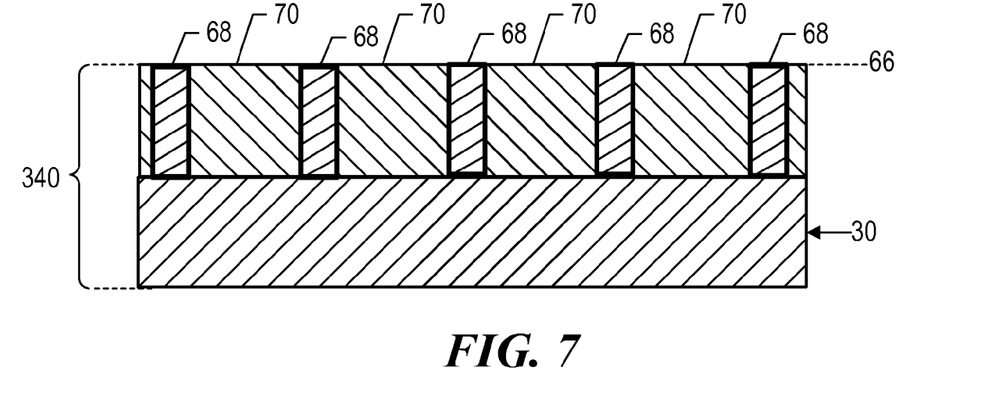
FIG. 7 is a simplified elevation view after a blanket etch of the multi-layered structure, shown in FIG. 6, and formation of a crown surface.

Referring to FIGS. 6 and 7, a blanket etch is employed to remove portions of conformal layer 46 to provide multi-layered structure 340 with a crown surface 66. Crown surface 66 is defined by an exposed surface 68 of each of protrusions 54 and upper surfaces of portions 70 that remain on conformal layer 46 after the blanket etch. The blanket etch may be a wet etch or dry etch. In a further embodiment, a chemical mechanical polishing/planarization may be employed to remove portions of conformal layer 46 to provide multi-layered structure 340 with crown surface 66.

Figure 8:
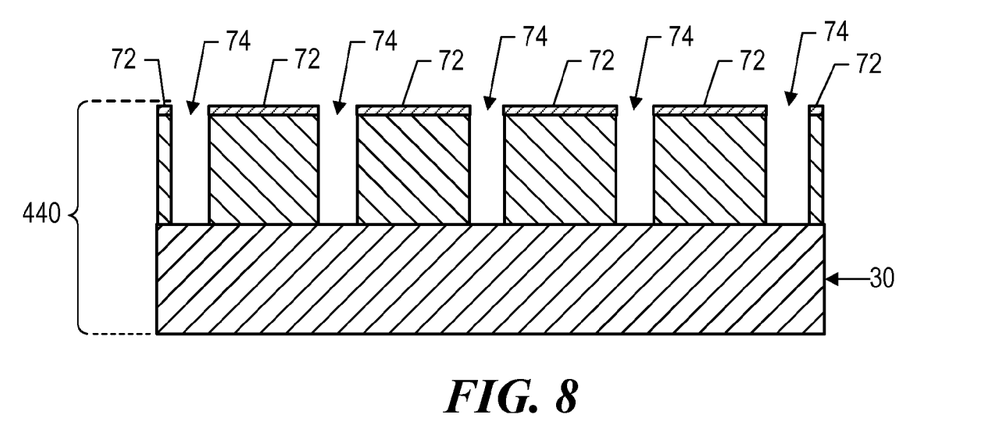
FIG. 8 is a simplified elevation view of the multi-layered structure, shown in FIG. 7, after subjecting the crown surface to an etch process to expose regions of a substrate.

Referring to FIGS. 6, 7 and 8, crown surface 66 is subjected to an anisotropic plasma etch. The etch chemistry of the anisotropic etch is selected to maximize etching of protrusions 54, while minimizing etching of portions 70. In the present example, advantage was taken of the distinction of the silicon content between protrusions 54 and conformal layer 46. Specifically, employing a plasma etch with an oxygen-based chemistry, it was determined that an in-situ hardened mask 72 would be created in the regions of portions 70 proximate to crown surface 66, forming a multi-layered structure 440. This results from the interaction of the silicon-containing polymerizable material with the oxygen plasma. As a result of hardened mask 72 and the anisotropy of the etch process, regions 74 in superimposition with protrusions 54 are exposed.

Figure 9:
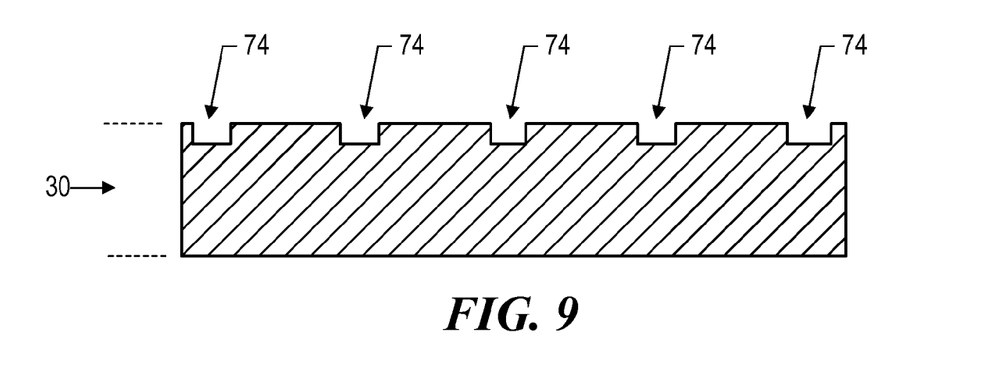
FIG. 9 is a simplified elevation view of the substrate, shown in FIG. 8, after transferring a pattern of the multi-layered structure therein.

Referring to FIGS. 8 and 9, the pattern defined by multi-layered structure 440 may form the basis of a pattern transferred into substrate 30. Specifically, the shape of the structure defined by multi-layered structure 440 may be transferred into substrate 30 by employing an anisotropic fluorine plasma etch. The benefit of this process is that recesses may be formed in substrate 30 with much smaller dimensions than the patterned layer, such as imaging layer 43, shown in FIG. 1, which forms the basis of the shapes of recesses. Also, were conformal layer 46, shown in FIG. 6, formed from a silicon-containing photo-responsive material, the removal of the conformal layer 46, shown in FIG. 6, may be achieved in a manner consistent with the removal of photo-resist material. As a result, it would not be necessary to employ a blanket fluorine etch.

Figure 10:
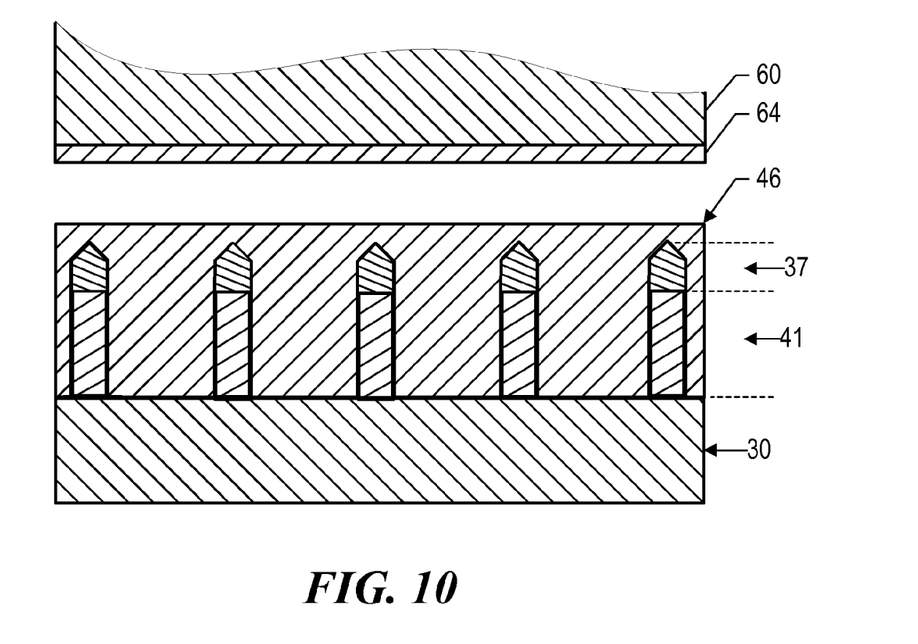
FIG. 10 is a simplified elevation view of the multi-layered structure, shown in FIG. 5, after deposition of a conformal layer in accordance with an alternate embodiment of the present invention.

Referring to FIGS. 4 and 10, another embodiment is shown that avoids having to employ the HF dip discussed above. Specifically, after formation of protrusions 42, conformal layer 46 is deposited. To that end, conformal layer 46 and the faceted regions of protrusions 42 are made from material having similar etch characteristics. Specifically, it is desired that the etch rate associated with the faceted regions be no greater than the etch rate associated with conformal layer 46. In this manner, a blanket etch may be performed as discussed above with respect to FIGS. 6 and 7. However, it should be understood that the surface need not be planar as shown above with respect to crown surface 66, shown in FIG. 7. Thereafter, recesses in regions 74 are formed in substrate 30 as discussed above in FIGS. 7, 8, and 9.

Figure 11:
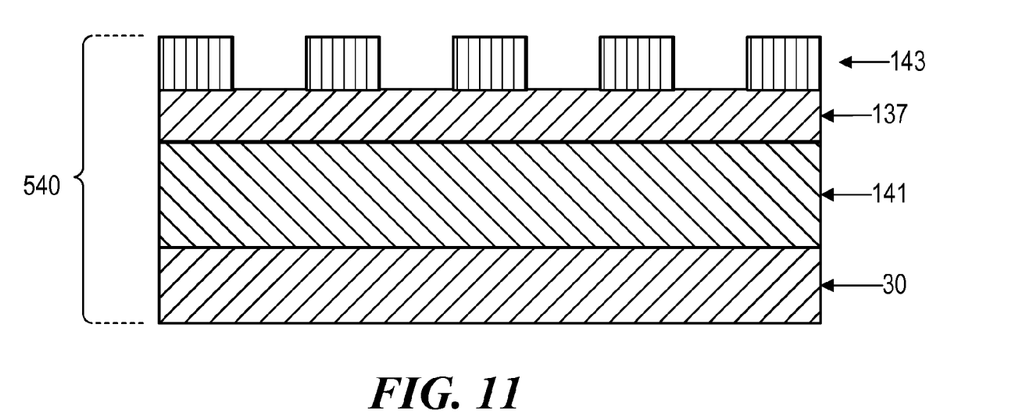
FIG. 11 is a simplified elevation view of a multi-layered structure in accordance with an alternate embodiment of the present invention.

Referring to FIG. 11, an additional embodiment of the present invention is described demonstrating that the foregoing process may be employed to form recessed structures in an existing layer on substrate 30. To that end, a multi-layered structure 540 is shown having substrate 30, an underlayer 141, a transfer layer 137, and an imaging layer 143, with underlayer 141 being positioned between transfer layer 137 and substrate 30 and transfer layer 137 being positioned between imaging layer 143 and underlayer 141. Transfer layer 137 and imaging layer 143 may be formed by the materials mentioned above with respect to transfer layer 37 and imaging layer 43, shown in FIG. 1, respectively, and may be formed as mentioned above with respect to transfer layer 37 and imaging layer 43, shown in FIG. 1, respectively.

Underlayer 141 may be formed from low-k materials such as silicon-containing low-k, BCB, silicon dioxide, spin-on-glass, FSG, and polysilicon. Underlayer 141 may be formed employing any of the techniques discussed above with respect to transfer layer 37 and imaging layer 43, shown in FIG. 1. In an exemplary embodiment, underlayer 141 may be deposited upon substrate 30 utilizing spin-coating techniques and consists of a low-k silicon-containing dielectric.

Figure 12:
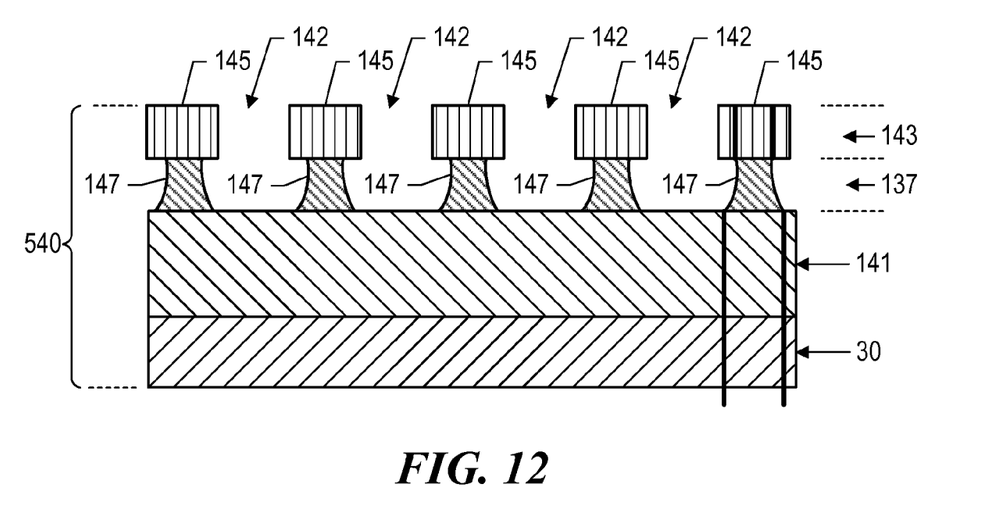
FIG. 12 is a simplified elevation view of the multi-layered structure, shown in FIG. 11, after the multi-layered structure is exposed to a trim etching process.
Figure 13:
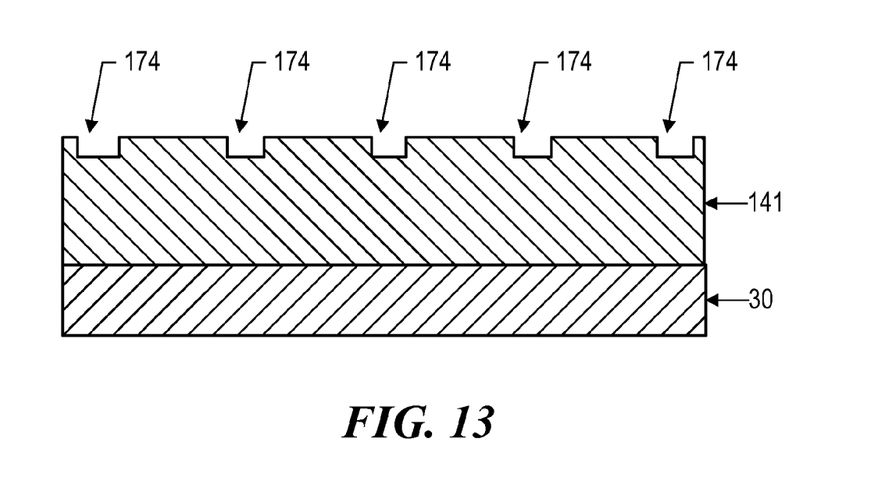
FIG. 13 is a simplified elevation view of the multi-layered structure, shown in FIG. 12, after post processing in accordance with an alternate embodiment of the present invention.

Referring to FIGS. 12 and 13, as mentioned above with respect to imaging layer 43 and transfer layer 37, shown in FIG. 1, imaging layer 143 has etch properties associated therewith differing from etch properties of transfer layer 137. In this manner, a trim etch procedure is employed to form protrusions 142. As shown, protrusions 142 are formed in a manner discussed above with respect to FIG. 3, excepting that unlike body 47, shown in FIG. 3, which extends between substrate 30 and features 45, shown in FIG. 3, body 147 extends between features 145 and underlayer 141. After subjecting multi-layered structure 540 to the above-mentioned trim etch process, additional processing may be undertaken as discussed above with respect to FIGS. 4, 5, 6, 7, 8 and 9 to obtain recessed structures 174 in underlayer 141. Although not shown, recessed structures 174 may extend completely through underlayer 141 and terminate at substrate 30.

Figure 14:
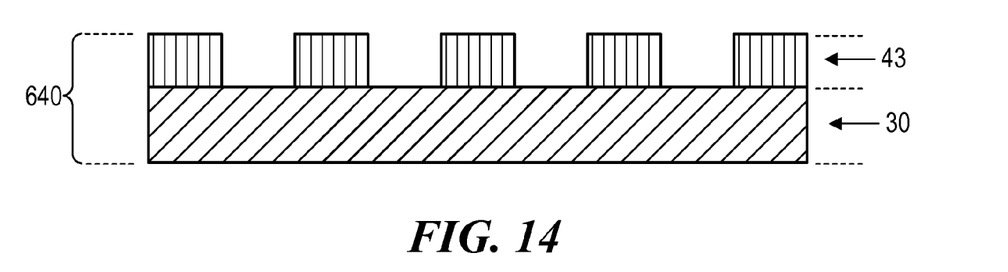
FIG. 14 is a simplified elevation view of a multi-layered structure in an alternate embodiment of the present invention.

Referring to FIG. 14, in a further embodiment, imaging layer 43 may be positioned upon substrate 30 forming multi-layered structure 640. Imaging layer 43 may be formed from an organic resist, such I-line, 193 nm, and 248 nm photolithography resists available from Rohm and Haas of Philadelphia, Pa. The description for I-line, 193 nm, and 248 nm photolithography resists is available from http://electronicmaterials.rohmhaas.com/businesses/micro/lithography/248photo.asp?caid=235 and is incorporated by reference herein. Imaging layer 43 may also be formed from an electron beam organic resist available from Zeon Corporation of Tokyo, Japan. The description for an electron beam organic resist is available from http://www.zeon.co.jp/business_e/enterprise/imagelec/zep7000.html and is incorporated by reference herein. To reduce the width '$a_1$' of features 45, imaging layer 43 may be subjected to an organic etch with an isotropic etch component. However, this may lead to features 45 becoming faceted, referred to as faceted material. Additional processing may be undertaken as discussed above with respect to FIGS. 4, 5, 6, 7, 8, and 9 to transfer the shape of the structure defined by multi-layered structure 640 into substrate 30. However, employing the blanket etch mentioned above with respect to FIGS. 6 and 7 on multi-layered structure 640 may require an over-etch to eliminate the above-mentioned faceted material.

Figure 15:
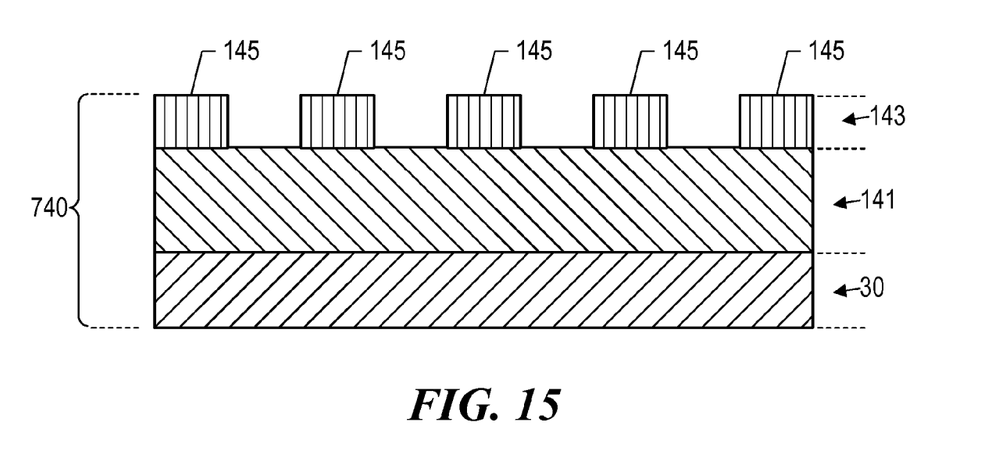
FIG. 15 is a simplified elevation view of a multi-layered structure in an alternate embodiment of the present invention.

Referring to FIG. 15, in a further embodiment, imaging layer 143 may be positioned upon underlayer 141 to form multi-layered structure 740, wherein multi-layered structure 740 may be subjected to the process mentioned above with respect to multi-layered structure 640 such that the shape of the structure defined by multi-layered structure 740 is transferred into underlayer 141.

The embodiments of the present invention described above are exemplary. Many changes and modifications may be made to the disclosure recited above, while remaining within the scope of the invention. The scope of the invention should, therefore, be determined with reference to the appended claims along with their full scope of equivalents.

What is claimed:

1. A method of forming recesses in a surface, said method comprising:

forming, on said surface, a transfer layer;

forming, on said transfer layer, a patterning layer having features with first dimensions and a first shape, said features having first and second sub-portions, said first sub-portions having a first thickness and said second sub-portions having a second thickness differing from said first thickness, with said first and second thicknesses being greater than zero;

transferring said features into said transfer layer, defining protrusions having second dimensions, differing from said first dimensions, and a second shape; and transferring an inverse of said second shape in said surface, defining said recesses.

2. The method as recited in claim 1 wherein transferring further includes transferring an inverse of said second shape into a substrate.

3. The method as recited in claim 1 wherein transferring further includes transferring an inverse of said second shape into an underlayer.

4. The method as recited in claim 1 wherein transferring further includes transferring an inverse of said second shape into a region of said surface in superimposition with one of said features.

5. The method as recited in claim 1 wherein transferring further includes transferring an inverse of said second shape into a region of an underlayer in superimposition with said features.

6. The method as recited in claim 1 further includes covering said plurality of protrusions with a conformal layer, with said conformal layer and a sub-portion of said protrusions being formed from material having comparable silicon content.

7. The method as recited in claim 1 further includes covering said plurality of protrusions with a conformal layer, with said conformal layer and a first sub-portion of said protrusions being formed from material having comparable silicon content and a second sub-portion of said protrusions having a silicon content that differs from said first portion.

8. The method as recited in claim 1 further includes covering said plurality of protrusions with a conformal layer, with said conformal layer and a first portion of said protrusions having similar etching characteristics for a given etch chemistry and a second portion of said protrusions having differing etching characteristic than said conformal layer for said given etch chemistry.

9. The method as recited in claim 1 wherein said second dimensions are less than said first dimensions.

10. The method as recited in claim 1 wherein transferring said features further includes trim etching said transfer layer to create said protrusions.

11. The method as recited in claim 1 wherein transferring said features further includes etching said transfer layer to create said protrusions and trim etching said protrusions.

12. The method as recited in claim 1 further includes covering said plurality of protrusions with a conformal layer, and selectively removing portions of said conformal layer and said protrusions to expose regions of said surface.

13. The method as recited in claim 1 wherein forming said patterning layer further comprises lithography processing said patterning layer, with said lithography processing selected from a group consisting essentially of photolithography, e-beam lithography, x-ray lithography, ion-beam lithography, atomic beam lithography, and imprint lithography.

14. A method of forming recesses in a surface, said method comprising:
    forming on said surface, a transfer layer;
    forming, on said transfer layer, a patterning layer having features with first dimensions and a first shape, said features having first and second sub-portions, said first sub-portions having a first thickness and said second sub-portions having a second thickness differing from said first thickness, with said first and second thicknesses being greater than zero;
    forming a plurality of protrusions including said features and portions of said transfer layer in superimposition therewith, said protrusions having second dimensions, differing from said first dimensions, and a second shape; and
    transferring an inverse of said second shape in said substrate, defining said recesses.

15. The method as recited in claim 14 wherein transferring further includes transferring an inverse of said second shape into a substrate.

16. The method as recited in claim 14 wherein transferring further includes transferring an inverse of said second shape into an underlayer.

17. The method as recited in claim 14 further includes covering said plurality of protrusions with a conformal layer, with said conformal layer and a sub-portion of said protrusions being formed from material having comparable silicon content.

18. The method as recited in claim 14 further includes covering said plurality of protrusions with a conformal layer, with said conformal layer and a first sub-portion of said protrusions being formed from material having comparable silicon content and a second sub-portion of said protrusions having a silicon content that differs from said first portion.

19. The method as recited in claim 14 further includes covering said plurality of protrusions with a conformal layer, with said conformal layer and a first portion of said protrusions having similar etching characteristics for a given etch chemistry and a second portion of said protrusions having differing etching characteristic than said conformal layer for said given etch chemistry.

20. The method as recited in claim 14 wherein forming said plurality of protrusions further includes trim etching said transfer layer.

21. The method as recited in claim 14 further covering said plurality of protrusions with a conformal layer, and selectively removing portions of said conformal layer and said protrusions to expose regions of said surface.

22. The method as recited in claim 14 wherein forming said patterning layer further comprises lithography processing said patterning layer, with said lithography processing selected from a group consisting essentially of photolithography, e-beam lithography, x-ray lithography, ion-beam lithography, atomic beam lithography, and imprint lithography.

23. A method of forming recesses in a surface, said method comprising:
    forming on said surface, a transfer layer;
    forming, on said transfer layer, a patterning layer having features with first dimensions and a first shape, said features having first and second sub-portions, said first sub-portions having a first thickness and said second sub-portions having a second thickness differing from said first thickness, with said first and second thicknesses being greater than zero;
    etching said plurality of features to define protrusions including said features and portions of said transfer layer in superimposition therewith, said protrusions having second dimensions, differing from said first dimensions, and a second shape; and
    transferring an inverse of said second shape in said surface, defining said recesses.

24. The method as recited in claim 23 wherein transferring further includes transferring an inverse of said second shape into a substrate.

25. The method as recited in claim 23 wherein transferring further includes transferring an inverse of said second shape into an underlayer.

26. The method as recited in claim 23 wherein transferring further includes transferring an inverse of said second shape into a region of said surface in superimposition with one of said features.

27. The method as recited in claim 23 wherein transferring further includes transferring an inverse of said second shape into a region of an underlayer in superimposition with said features.

28. The method as recited in claim 23 further includes covering said plurality of protrusions with a conformal layer, with said conformal layer and a sub-portion of said protrusions being formed from material having comparable silicon content.

29. The method as recited in claim 23 further includes covering said plurality of protrusions with a conformal layer, with said conformal layer and a first sub-portion of said protrusions being formed from material having comparable silicon content and a second sub-portion of said protrusions having a silicon content that differs from said first portion.

30. The method as recited in claim 23 further includes covering said plurality of protrusions with a conformal layer, with said conformal layer and a first portion of said protrusions having similar etching characteristics for a given etch chemistry and a second portion of said protrusions having differing etching characteristic than said conformal layer for said given etch chemistry.

31. The method as recited in claim 23 wherein said second dimensions are less than said first dimensions.

32. The method as recited in claim 23 wherein etching said plurality of features further includes trim etching said transfer layer to create said protrusions.

33. The method as recited in claim 23 wherein etching said plurality of features further includes etching said transfer layer to create said protrusions and trim etching said protrusions.

34. The method as recited in claim 23 further includes covering said plurality of protrusions with a conformal layer, and selectively removing portions of said conformal layer and said protrusions to expose regions of said surface.

35. The method as recited in claim 23 wherein forming said patterning layer further comprises lithography processing said patterning layer, with said lithography processing selected from a group consisting essentially of photolithography, e-beam lithography, x-ray lithography, ion-beam lithography, atomic beam lithography, and imprint lithography.

36. A method of forming recesses in a surface, said method comprising:

forming on said surface, a transfer layer;

forming, on said transfer layer, an imaging layer having features with first dimensions and a first shape, said features having first and second sub-portions, said first sub-portions having a first thickness and said second sub-portions having a second thickness differing from said first thickness, with said first and second thicknesses being greater than zero;

trim etching said plurality of features to define protrusions including said features and portions of said transfer layer in superimposition therewith, said protrusions having second dimensions, differing from said first dimensions, and a second shape;

covering said plurality of protrusions with a conformal layer; and transferring an inverse of said second shape in said surface, defining said recesses.

37. The method as recited in claim 36 wherein forming said patterning layer further comprises lithography processing said patterning layer, with said lithography processing selected from a group consisting essentially of photolithography, e-beam lithography, x-ray lithography, ion-beam lithography, atomic beam lithography, and imprint lithography.

* * * * *